(12) United States Patent
Hebach et al.

(10) Patent No.: US 8,550,106 B2
(45) Date of Patent: Oct. 8, 2013

(54) PRESSURE-RELIEF VALVE OF A HOUSING FOR AN ELECTRICAL/ELECTRONIC UNIT

(75) Inventors: Andreas Hebach, Ludwigsburg (DE); Norman Krings, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/139,375

(22) PCT Filed: Nov. 27, 2009

(86) PCT No.: PCT/EP2009/065955
§ 371 (c)(1),
(2), (4) Date: Jun. 13, 2011

(87) PCT Pub. No.: WO2010/066596
PCT Pub. Date: Jun. 17, 2010

(65) Prior Publication Data
US 2011/0247952 A1  Oct. 13, 2011

(30) Foreign Application Priority Data
Dec. 12, 2008  (DE) .......................... 10 2008 054 577

(51) Int. Cl.
*F24D 19/08* (2006.01)
(52) U.S. Cl.
USPC .......................................... 137/197; 137/171
(58) Field of Classification Search
USPC .................................. 137/171–204
See application file for complete search history.

(56) References Cited

U.S. PATENT DOCUMENTS

| | | | | |
|---|---|---|---|---|
| 3,326,230 A * | 6/1967 | Ulrich | | 137/199 |
| 4,071,040 A * | 1/1978 | Moriarty | | 137/199 |
| 4,245,617 A * | 1/1981 | Buckley | | 126/638 |
| 5,070,899 A * | 12/1991 | Matkovich et al. | | 137/455 |
| 5,125,428 A * | 6/1992 | Rauter | | 137/199 |
| 7,294,354 B2 * | 11/2007 | Gunter et al. | | 426/118 |
| 2002/0090506 A1 | 7/2002 | Protzner et al. | | |
| 2003/0094101 A1 | 5/2003 | Hara et al. | | |
| 2003/0216119 A1 | 11/2003 | Mashiko et al. | | |
| 2009/0109618 A1 | 4/2009 | Yano | | |

FOREIGN PATENT DOCUMENTS

| | | |
|---|---|---|
| EP | 1313359 A2 | 5/2003 |
| EP | 1363484 A2 | 11/2003 |
| EP | 1784066 A1 | 5/2007 |
| EP | 1997685 A1 | 12/2008 |
| JP | 2006041304 | 2/2006 |
| JP | 2008237949 | 10/2008 |
| WO | WO 2007038299 A2 * | 4/2007 |

OTHER PUBLICATIONS

PCT/EP2009/065955 International Search Report.

* cited by examiner

*Primary Examiner* — John Rivell
*Assistant Examiner* — Angelisa Hicks
(74) *Attorney, Agent, or Firm* — Michael Best & Friedrich LLP

(57) ABSTRACT

The invention relates to a pressure-relief valve of a housing for an electrical/electronic unit, particularly for a housing of a control unit of a motor vehicle, comprising a pressure equalization element, which comprises a membrane. It is provided that at least one hydrophobic layer (22) is located on the membrane (21). The invention further relates to a housing (1) for an electrical/electronic unit (2), particularly of a control unit (4) of a motor vehicle, comprising such a pressure-relief valve (11).

20 Claims, 3 Drawing Sheets

PRESSURE-RELIEF VALVE OF A HOUSING FOR AN ELECTRICAL/ELECTRONIC UNIT

BACKGROUND OF THE INVENTION

The invention relates to a pressure-relief valve of a housing for an electrical/electronic unit, with a pressure-equalizing element which comprises a membrane.

Electrical and/or electronic units inserted into housings, in particular control-device circuits of motor vehicles, must be ventilated for necessary pressure equalization, in order to prevent malfunctions from being caused for example by overpressure, underpressure or condensing air moisture. It is known in the prior art to perform such ventilating operations on plug-in elements of a plug/harness connection, which have a passage into the housing at a protected location. A disadvantage of these embodiments is that air moisture or splash water can enter the housing through these passages. In unfavorable cases, this can allow corrosion to occur inside the housing, in particular on the electrical or electronic unit. In other unfavorable cases, such ventilation is inadequate, in particular due to the small size of the passage of the plug/harness connection, so that damage to the electrical or electronic unit may occur due to inadequate ventilating and venting.

SUMMARY OF THE INVENTION

The object of the invention is to provide a pressure-relief valve of a housing of the generic type that avoids the stated disadvantages and offers sufficient ventilating and venting of the housing, but at the same time avoids the ingress of moisture.

For this purpose, a pressure-relief valve of a housing for an electrical/electronic unit is proposed, in particular for a housing of a control device of a motor vehicle, with a pressure-equalizing element which comprises a membrane. It is at the same time provided that on the membrane there is at least one hydrophobic layer. The hydrophobic layer hereby prevents moisture from passing through, and does so both in the gas phase and in the liquid phase of the moisture. An overpressure in the housing causes a formation of micropores in the hydrophobic layer, by which the overpressure can be reduced. The relative pressure necessary for this is dependent on the type and nature of the hydrophobic layer and as a result can be adapted to the intended use; such a relative pressure in the case of known hydrophobic substances usually lies in the range between one millibar and twenty millibars. If there is underpressure in the housing, a pressure equalization takes place, as described above, effectively avoiding ingress of moisture through the hydrophobic layer. The hydrophobic layer has the task of closing the pores of the membrane, which may be wider, for liquid, but at the same time allowing the gases to enter or exit from the housing, in particular making the pressure equalization described above possible.

In one embodiment it is provided that the membrane is a perforated sheet of plastic. A perforated sheet of plastic is the simplest type of membrane in principle, just with an arrangement of holes comprising at least one hole provided in the sheet of plastic. The number and arrangement of such perforations in the sheet of plastic determine the rate and the volume of the gas possibly exiting from or entering the housing; they also determine the type of formation of micropores in the hydrophobic layer arranged on it. The perforations of the sheet of plastic are then preferably chosen to be so small that the hydrophobic layer remains completely closed during pressure equalization, without the hydrophobic layer seeping into holes that have for example become large.

In a further embodiment, the membrane consists of a breathable membrane or comprises such a membrane. Breathable membranes are, for example, known in applications for clothing, in particular functional clothing for sportsmen or women or leisure activities. For example, membranes of this type are marketed under the name Gore-Tex. Membranes of this type are already well suited in principle for the application area described, but are not reliably waterproof. In particular, with breathable membranes it is still possible for water in the vapor phase to pass through. To prevent this, the hydrophobic layer is applied to the membrane. Together with the properties of the breathable membrane, as the latter is known from the prior art, very good sealing against water even in the gas phase is achieved, with at the same time good gas permeability for the purpose of pressure equalization.

In one embodiment, the hydrophobic layer is a layer of oil. A layer of oil is a particularly simple and inexpensive form of a hydrophobic layer. In the region of the layer of oil, water is reliably repelled. The layer of oil can possibly be protected from evaporating or be deactivated in a suitable way by the addition of additives.

In a preferred embodiment, the hydrophobic layer consists of a layer consisting of or comprising long-chain, functionalized hydrocarbons, in particular a layer of silicone oil and/or a layer of perfluorinated oil. These offer good long-term stability and good protection against seepage, the vapor pressure being low enough to ensure long use. In particular, the vapor pressure of these long-chain, functionalized hydrocarbons is significantly lower than that of pure, commonly used oils. Particularly suitable here are partially polymerized, partly fluorinated or siliconized films, which have in particular the character of a gel and have here a very low vapor pressure with at the same time adequate flow. Films of this type can be particularly advantageously provided stably on the membrane and kept there in a functional and stable state over a long time.

In a further embodiment, it is provided that the hydrophobic layer is on both sides of the membrane. In this form, moisture is prevented from passing through particularly reliably. In particular, the use of a water-binding film is also possible here, to be specific on one side or alternatively on both sides of the membrane, the water-binding film expelling water that it has picked up when a specific temperature is reached, in particular an operating temperature of the electrical or electronic unit in the housing, and thereby regenerating itself.

In a further embodiment, it is provided that the pressure-equalizing element comprises two membranes, between which the hydrophobic layer is arranged. Here, the hydrophobic layer may be a layer of oil, as described above, or else a water-binding film which releases the picked-up water again when a specific temperature is reached. Furthermore, it may very advantageously be envisaged to provide both a hydrophobic layer and a water-binding film, which complement each other in their functions.

Also proposed is a housing for an electrical/electronic unit, in particular a control device on the motor vehicle, with a pressure-relief valve, formed according to one or more of the exemplary embodiments described above.

BRIEF DESCRIPTION OF THE DRAWINGS

The invention is explained in more detail below on the basis of exemplary embodiments, without however being restricted to these.

In the drawing

DETAILED DESCRIPTION

Figure 1:
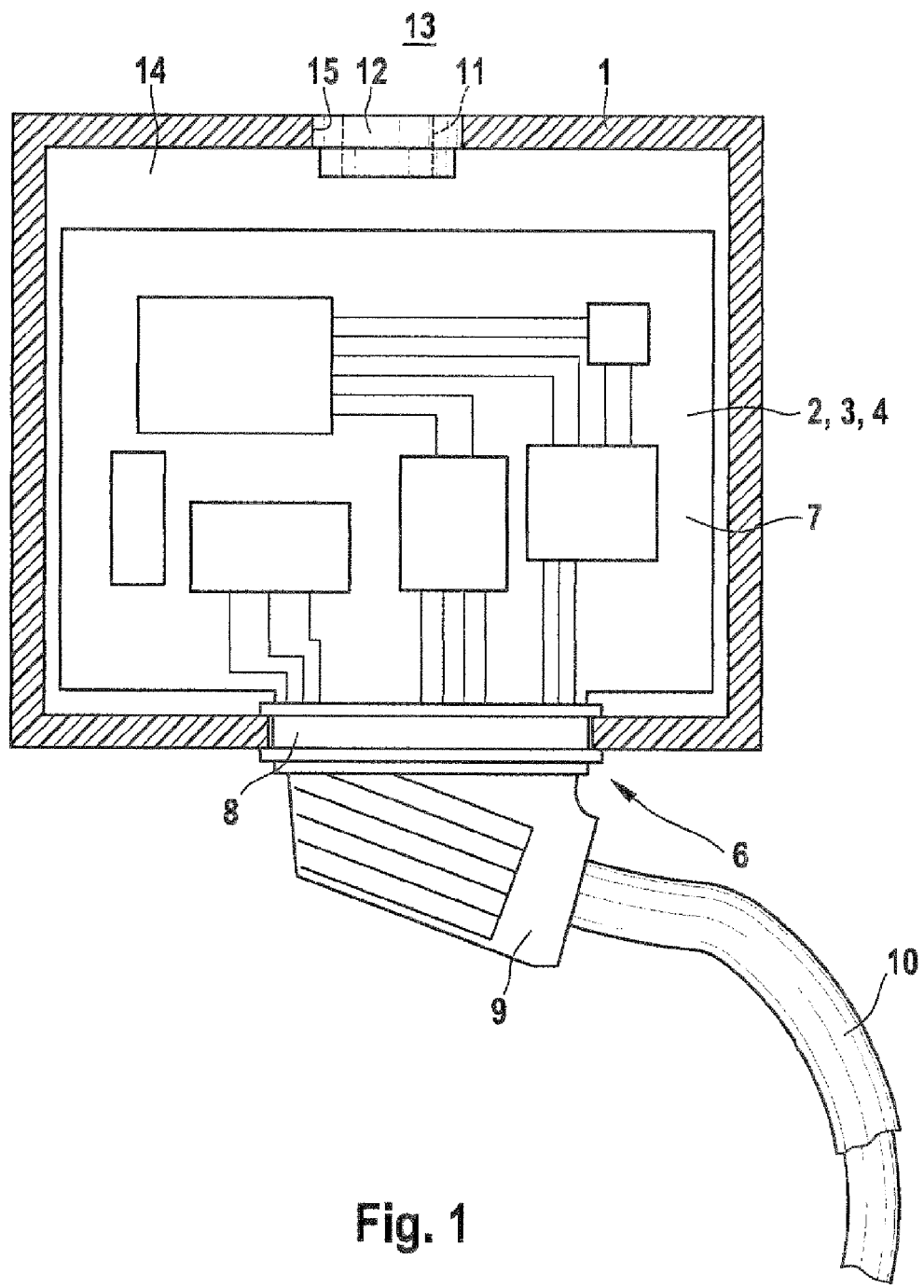
FIG. 1 shows a housing for an electrical/electronic unit with a pressure-equalizing valve.

FIG. 1 shows a housing 1 for an electronic unit 2, to be specific an electronic circuit 3, to be specific a control device 4 for a motor vehicle that is not represented. The housing 1 is accordingly formed as a control device housing 5. The housing 1 has on the underside a connection unit 6, which consists of a male connector 8, which is connected to a printed circuit board 7 of the electronic circuit 3 and is fitted, in particular tightly fitted, in the housing 1, and a female connector 9 corresponding thereto, the female connector 9 having a connection cable 10 for connection to further systems that are not represented. The housing 1 is hermetically sealed in the closed state, that is to say for example when the cover is fitted on. To make possible a pressure equalization that is required during the operation of the electronic unit 2, the housing 1 has a pressure-relief valve 11, with a pressure-equalizing element 12, which makes it possible to create a connection between a surrounding area 13 of the housing 1 and an interior housing space 14 for the pressure equalization. Here, the pressure-relief valve has been introduced into the housing 1, to be specific by means of a housing opening 15, which serves for receiving the pressure-relief valve 11 and is closed by the pressure-relief valve 11. The introduction of the pressure-relief valve 11 into the housing opening 15 takes place by clipping, adhesive bonding or preferably by screwing by means of a thread that is not separately represented here.

Figure 2:
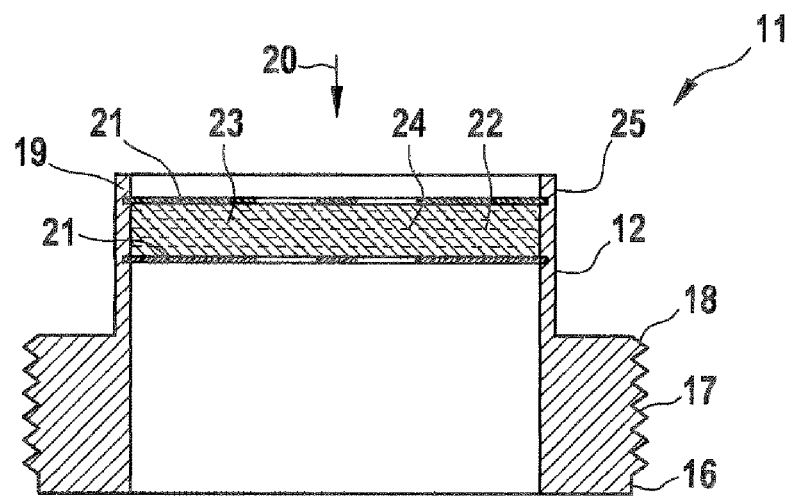
FIG. 2 shows a pressure-equalizing valve with two membranes and a gel film disposed between them and FIG. 3 shows a pressure-equalizing valve with a membrane and an oil film.

FIG. 2 shows the pressure-relief valve 11 with the pressure-equalizing element 12, as described in FIG. 1. Here, the pressure-relief valve 11 has in a connection region 16 an external thread 17, which corresponds to an internal thread of the housing 1 that is not represented (compare FIG. 1) and, when screwed in, preferably produces a hermetic seal by the geometry and nature of its tooth flanks 18. This ensures that the pressure equalization takes place by way of the pressure-equalizing element 12, but not undesirably by way of thread turns, along which gases could creep. The pressure-equalizing element 12 has within a valve body 19, embedded therein and arranged substantially transversely to a pressure passing-through direction 20, two membranes 21, between which a hydrophobic layer 22 is embedded. The hydrophobic layer 22 is preferably formed here as a layer of gel 23. This preferably comprises a partially polymerized, partly fluorinated or siliconized, highly viscous oil 24 with a low vapor pressure. The membranes 21 are formed here such that they avoid undesired flowing of the hydrophobic layer 22 or running out from the intended region of the pressure-equalizing element 12. In the simplest case, at least one of the membranes 21 consists of a sheet of plastic 25 which has perforations to make it possible for gas to pass through the sheet of plastic 25.

Figure 3:
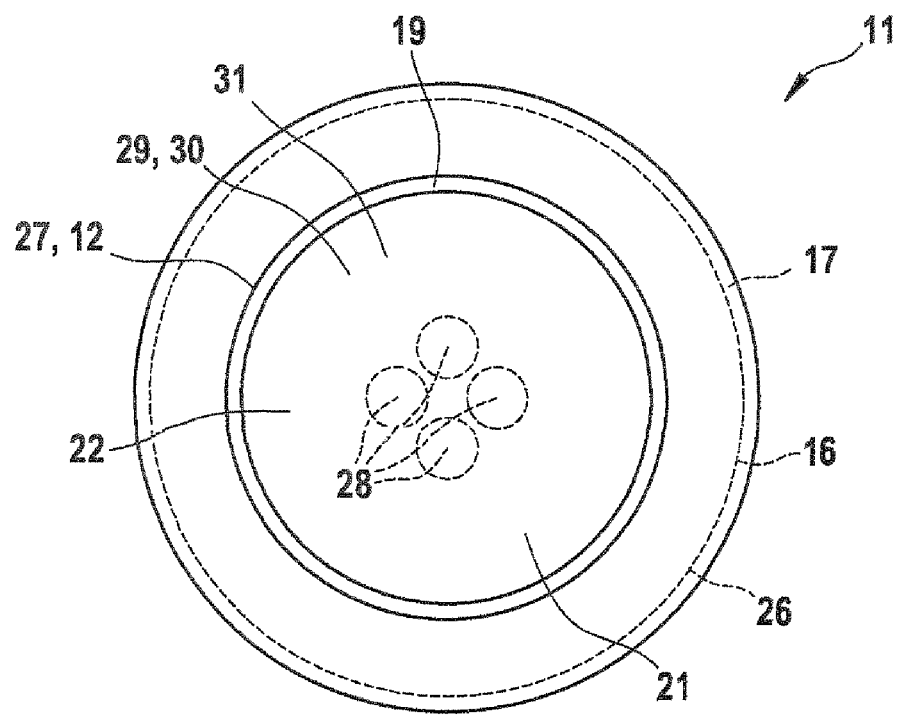

FIG. 3 shows a pressure-relief valve 11 in plan view similar to that described in FIG. 2, with the connection region 16, which substantially forms a screw body 26 and particularly comprises the external thread 17 (compare FIG. 2), and an actual valve body 27, which is formed by the pressure-equalizing element 12. Incorporated in the screw body 26 are through-openings 28, which allow ambient air to enter through the valve body 27 to the pressure-equalizing element 12 and act here on the individually arranged membrane 21 and the hydrophobic layer 22. The membrane may, for example, be a Gore-Tex membrane or a plastic membrane, an oil film 29 or a layer of oil 31 being provided here on the membrane 21 as the hydrophobic layer 22. The oil film 29 is an additized silicone layer 30, which on account of its low gas pressure remains stably on the membrane 21.

Figure 4:
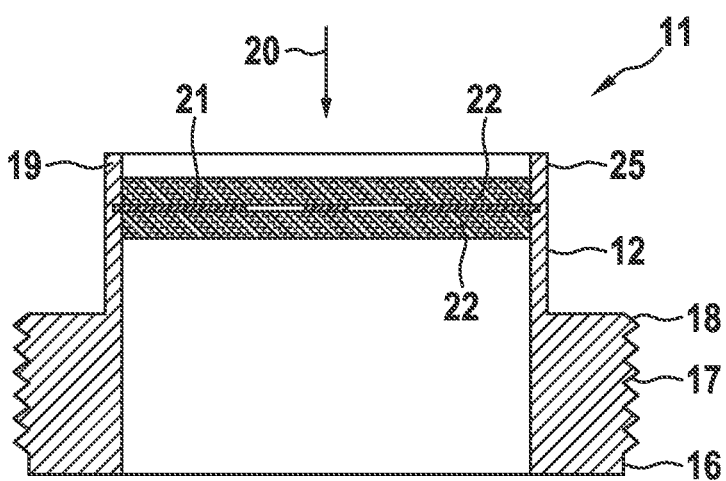
FIG. 4 shows a pressure-equalizing valve with a membrane and hydrophobic layer on both sides of the membrane.

FIG. 4 shows a pressure-relief valve 11 in plan view similar to that described in FIG. 2 and FIG. 3, with the connection region 16, which comprises the external thread 17 and tooth flanks 18. The pressure-relief valve 11 may comprise a hydrophobic layer 22 on both sides of the membrane 21.

The invention claimed is:

1. A pressure-relief valve of a housing for an electrical/electronic unit, with a pressure-equalizing element which comprises a membrane, characterized in that on the membrane (21) there is at least one hydrophobic layer (22), wherein the hydrophobic layer (22) is a layer of gel (23).

2. The pressure-relief valve as claimed in claim 1, characterized in that the membrane (21) is a perforated sheet of plastic (25).

3. The pressure-relief valve as claimed in claim 1, characterized in that the membrane (21) is a breathable membrane.

4. The pressure-relief valve as claimed in one claim 1, characterized in that the hydrophobic layer (22) is a layer of oil (31).

5. The pressure-relief valve as claimed in claim 1, characterized in that the hydrophobic layer (22) is a layer consisting of long-chain, functionalized hydrocarbons.

6. The pressure-relief valve as claimed in claim 1, characterized in that the hydrophobic layer (22) is on both sides of the membrane (21).

7. The pressure-relief valve as claimed in claim 1, characterized in that the pressure-equalizing element (12) comprises two membranes (21), between which the hydrophobic layer (22) is arranged.

8. A housing (1) for an electrical/electronic unit (2), with a pressure-relief valve (11), formed according to claim 1.

9. The housing as claimed in claim 8, wherein the housing is for a control device of a motor vehicle.

10. The housing as claimed in claim 8, characterized in that the membrane (21) is a perforated sheet of plastic (25).

11. The housing as claimed in claim 8, characterized in that the membrane (21) is a breathable membrane.

12. The housing as claimed in one claim 8, characterized in that the hydrophobic layer (22) is a layer of oil (31).

13. The housing as claimed in claim 8, characterized in that the hydrophobic layer (22) is a layer consisting of long-chain, functionalized hydrocarbons.

14. The housing as claimed in claim 8, characterized in that the hydrophobic layer (22) is on both sides of the membrane (21).

15. The housing as claimed in claim 8, characterized in that the pressure-equalizing element (12) comprises two membranes (21), between which the hydrophobic layer (22) is arranged.

16. The housing as claimed in claim 8, characterized in that the membrane (21) includes a breathable membrane.

17. The housing as claimed in claim 8, characterized in that the hydrophobic layer (22) is at least one of a layer silicone oil and a layer of perfluorinated oil (31).

18. The pressure-relief valve as claimed in claim 1, wherein the valve is for a housing of a control device of a motor vehicle.

19. The pressure-relief valve as claimed in claim 1, characterized in that the membrane (21) includes a breathable membrane.

20. The pressure-relief valve as claimed in claim 1, characterized in that the hydrophobic layer (22) is at least one of a layer silicone oil and a layer of perfluorinated oil (31).

* * * * *